United States Patent
Ando et al.

(10) Patent No.: US 9,865,703 B2
(45) Date of Patent: Jan. 9, 2018

(54) HIGH-K LAYER CHAMFERING TO PREVENT OXYGEN INGRESS IN REPLACEMENT METAL GATE (RMG) PROCESS

(71) Applicant: International Business Machines Corporation, Armonk, NY (US)

(72) Inventors: Takashi Ando, Tuckahoe, NY (US); Veeraraghavan S. Basker, Schenectady, NY (US); Johnathan E. Faltermeier, San Jose, CA (US); Hemanth Jagannathan, Niksayuna, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/985,733

(22) Filed: Dec. 31, 2015

(65) Prior Publication Data

US 2017/0194459 A1    Jul. 6, 2017

(51) Int. Cl.
| | |
|---|---|
| H01L 29/66 | (2006.01) |
| H01L 29/40 | (2006.01) |
| H01L 29/76 | (2006.01) |
| H01L 29/78 | (2006.01) |
| H01L 29/423 | (2006.01) |

(52) U.S. Cl.
CPC ...... H01L 29/66545 (2013.01); H01L 29/401 (2013.01); H01L 29/42364 (2013.01); H01L 29/6653 (2013.01); H01L 29/66795 (2013.01); H01L 29/785 (2013.01)

(58) Field of Classification Search
CPC ............ H01L 29/66545; H01L 29/401; H01L 29/42364; H01L 29/6653; H01L 29/66795; H01L 29/785
See application file for complete search history.

(56) References Cited

U.S. PATENT DOCUMENTS

| | | |
|---|---|---|
| 4,520,553 A | 6/1985 | Kraft |
| 7,998,832 B2 | 8/2011 | Carter |

(Continued)

*Primary Examiner* — Ida M Soward
(74) *Attorney, Agent, or Firm* — Daniel P. Morris; Otterstedt, Ellenbogen & Kammer, LLP

(57) ABSTRACT

A semiconductor structure includes a semiconductor substrate having an outer surface; a plurality of oxide regions, located outward of the outer surface, and defining a plurality of metal-gate-stack-receiving cavities; and a liner interspersed between the plurality of oxide regions and the semiconductor substrate and between the plurality of oxide regions and the plurality of metal-gate-stack-receiving cavities. A layer of high-K material is deposited over the semiconductor structure, including on outer surfaces of the plurality of oxide regions, outer edges of the liner, on walls of the plurality of metal-gate-stack-receiving cavities, and on the outer surface of the semiconductor substrate within the plurality of metal-gate-stack-receiving cavities. The layer of high-K material is chamfered to remove same from the outer surfaces of the plurality of oxide regions, the outer edges of the liner, and partially down the walls of the plurality of metal-gate-stack-receiving cavities.

7 Claims, 20 Drawing Sheets

(56) References Cited

U.S. PATENT DOCUMENTS

| | | | | |
|---|---|---|---|---|
| 8,188,552 B2* | 5/2012 | Huang | H01L 27/10876 | |
| | | | 257/401 | |
| 8,193,641 B2* | 6/2012 | Rachmady | H01L 21/28088 | |
| | | | 257/758 | |
| 8,217,472 B2 | 7/2012 | Carter | | |
| 8,367,496 B2 | 2/2013 | Ando | | |
| 8,405,135 B2* | 3/2013 | Yang | H01L 23/5223 | |
| | | | 257/301 | |
| 8,440,533 B2 | 5/2013 | Toh | | |
| 8,481,389 B2* | 7/2013 | Zhang | H01L 21/823462 | |
| | | | 257/411 | |
| 8,765,546 B1* | 7/2014 | Hung | H01L 21/823431 | |
| | | | 257/190 | |
| 8,822,283 B2* | 9/2014 | Ng | H01L 21/823807 | |
| | | | 257/288 | |
| 8,835,245 B2* | 9/2014 | Baars | H01L 21/823475 | |
| | | | 257/532 | |
| 8,951,855 B2* | 2/2015 | Lai | H01L 21/823842 | |
| | | | 438/199 | |
| 8,999,831 B2 | 4/2015 | Ando | | |
| 9,018,054 B2* | 4/2015 | Yoshida | H01L 21/28079 | |
| | | | 438/163 | |
| 9,018,711 B1* | 4/2015 | Cai | H01L 21/28008 | |
| | | | 257/369 | |
| 9,231,080 B2* | 1/2016 | Horak | H01L 29/66545 | |
| 9,362,377 B1* | 6/2016 | Kim | H01L 29/4966 | |
| 9,368,592 B2* | 6/2016 | Li | H01L 29/4966 | |
| 9,437,495 B2* | 9/2016 | Lee | H01L 29/7833 | |
| 9,455,227 B1* | 9/2016 | Hung | H01L 29/66545 | |
| 9,466,676 B2* | 10/2016 | Kamineni | H01L 29/401 | |
| 9,524,965 B2* | 12/2016 | Ho | H01L 27/088 | |
| 9,548,250 B1* | 1/2017 | Basker | H01L 21/823821 | |
| 2011/0254063 A1 | 10/2011 | Chen | | |
| 2013/0099307 A1* | 4/2013 | Tseng | H01L 21/28088 | |
| | | | 257/330 | |
| 2013/0280900 A1* | 10/2013 | Lai | H01L 21/823842 | |
| | | | 438/589 | |
| 2013/0320412 A1* | 12/2013 | Yamasaki | H01L 21/823842 | |
| | | | 257/288 | |
| 2014/0008720 A1* | 1/2014 | Xie | H01L 27/092 | |
| | | | 257/331 | |
| 2014/0065783 A1 | 3/2014 | Chudzik | | |
| 2014/0183434 A1* | 7/2014 | Lim | H01L 27/2463 | |
| | | | 257/4 | |
| 2014/0346584 A1 | 11/2014 | Purayath | | |
| 2015/0084132 A1* | 3/2015 | Chou | H01L 29/518 | |
| | | | 257/369 | |
| 2015/0111373 A1* | 4/2015 | Cote | H01L 21/823468 | |
| | | | 438/586 | |
| 2016/0042954 A1* | 2/2016 | Sung | H01L 21/28123 | |
| | | | 257/407 | |
| 2016/0079067 A1* | 3/2016 | Chien | H01L 21/28114 | |
| | | | 438/591 | |
| 2016/0079071 A1* | 3/2016 | Chiang | H01L 21/28518 | |
| | | | 438/586 | |
| 2016/0086949 A1* | 3/2016 | Chern | H01L 27/0207 | |
| | | | 257/392 | |
| 2016/0099181 A1* | 4/2016 | Tung | H01L 21/823821 | |
| | | | 257/369 | |
| 2016/0104786 A1* | 4/2016 | Yang | H01L 29/4966 | |
| | | | 257/369 | |
| 2016/0149050 A1* | 5/2016 | Basu | H01L 29/0603 | |
| | | | 257/192 | |
| 2016/0293492 A1* | 10/2016 | Fan | H01L 21/823456 | |
| 2016/0293493 A1* | 10/2016 | Fan | H01L 21/823462 | |
| 2016/0293725 A1* | 10/2016 | Liou | H01L 29/66545 | |
| 2016/0336426 A1* | 11/2016 | Chang | H01L 29/66545 | |
| 2017/0033223 A1* | 2/2017 | Leobandung | H01L 21/7682 | |
| 2017/0084722 A1* | 3/2017 | Lu | H01L 29/66795 | |

* cited by examiner

HIGH-K LAYER CHAMFERING TO PREVENT OXYGEN INGRESS IN REPLACEMENT METAL GATE (RMG) PROCESS

FIELD

The present disclosure relates generally to semiconductor devices and fabrication methods, and more specifically, to field effect transistor (FET) structures and methods of fabrication thereof.

BACKGROUND

In the Replacement Metal Gate (RMG) process, oxygen ingress during high temperature processing is a common issue causing threshold voltage ($V_t$) to roll up in n-type FETs (NFETs) and roll down in p-type FETs (PFETs). It is also well known that high-K metal oxides (dielectric constant higher than $SiO_2$) have ionic bonds and tend to transport oxygen via oxygen vacancies when in contact with a deposited oxide material and subjected to a high temperature annealing process. In the state-of-the-art RMG flow, the high-K is in contact with deposited films in the middle-of-the-line (MOL), and could be causing the short-channel $V_t$ shift observed in RMG devices.

SUMMARY

Principles of the present disclosure provide techniques for high-K layer chamfering to prevent oxygen ingress in the replacement metal gate (RMG) process.

In one aspect, an exemplary method includes providing a semiconductor structure including a semiconductor substrate having an outer surface; a plurality of oxide regions, located outward of the outer surface of the semiconductor substrate, and defining a plurality of metal-gate-stack-receiving cavities; and a liner interspersed between the plurality of oxide regions and the semiconductor substrate and between the plurality of oxide regions and the plurality of metal-gate-stack-receiving cavities. A further step includes depositing a layer of high-K material over the semiconductor structure, including on outer surfaces of the plurality of oxide regions, outer edges of the liner, on walls of the plurality of metal-gate-stack-receiving cavities, and on the outer surface of the semiconductor substrate within the plurality of metal-gate-stack-receiving cavities. A further step includes chamfering the layer of high-K material to remove same from the outer surfaces of the plurality of oxide regions, the outer edges of the liner, and partially down the walls of the plurality of metal-gate-stack-receiving cavities, to obtain a first intermediate structure.

In another aspect, an exemplary semiconductor structure includes a semiconductor substrate having an outer surface; a plurality of metal gate stacks located outward of the outer surface of the semiconductor substrate; a plurality of oxide regions, located outward of the outer surface of the semiconductor substrate, and interspersed between the plurality of metal gate stacks; a liner interspersed between the plurality of oxide regions and the semiconductor substrate and between the plurality of oxide regions and the plurality of metal gate stacks; and a plurality of high-K layers separating the plurality of metal gate stacks from the semiconductor substrate and separating the plurality of metal gate stacks from the plurality of oxide regions. The plurality of oxide regions and the plurality of metal gate stacks extend outwardly a first height from the semiconductor substrate, and the plurality of high-K layers extend outwardly a second height from the semiconductor substrate. The second height is less than the first height.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided. For example, one or more embodiments advantageously reduce or eliminate undesirable threshold voltage changes in the Replacement Metal Gate (RMG) process, caused by oxygen ingress during high temperature processing.

These and other features and advantages of the present disclosure will become apparent from the following detailed description of illustrative embodiments thereof, which is to be read in connection with the accompanying drawings.

DETAILED DESCRIPTION

As noted, in the Replacement Metal Gate (RMG) process, oxygen ingress during high temperature processing is a common issue causing threshold voltage ($V_t$) to roll up in n-type FETs (NFETs) and roll down in p-type FETs (PFETs). It is also well known that high-K metal oxides (dielectric constant higher than $SiO_2$) have ionic bonds and tend to transport oxygen via oxygen vacancies when in contact with a deposited oxide material and subjected to a high temperature annealing process. In the state-of-the-art RMG flow, the high-K is in contact with deposited films in the middle-of-the-line (MOL), and could be causing the short-channel $V_t$ shift observed in RMG devices.

Figure 1:
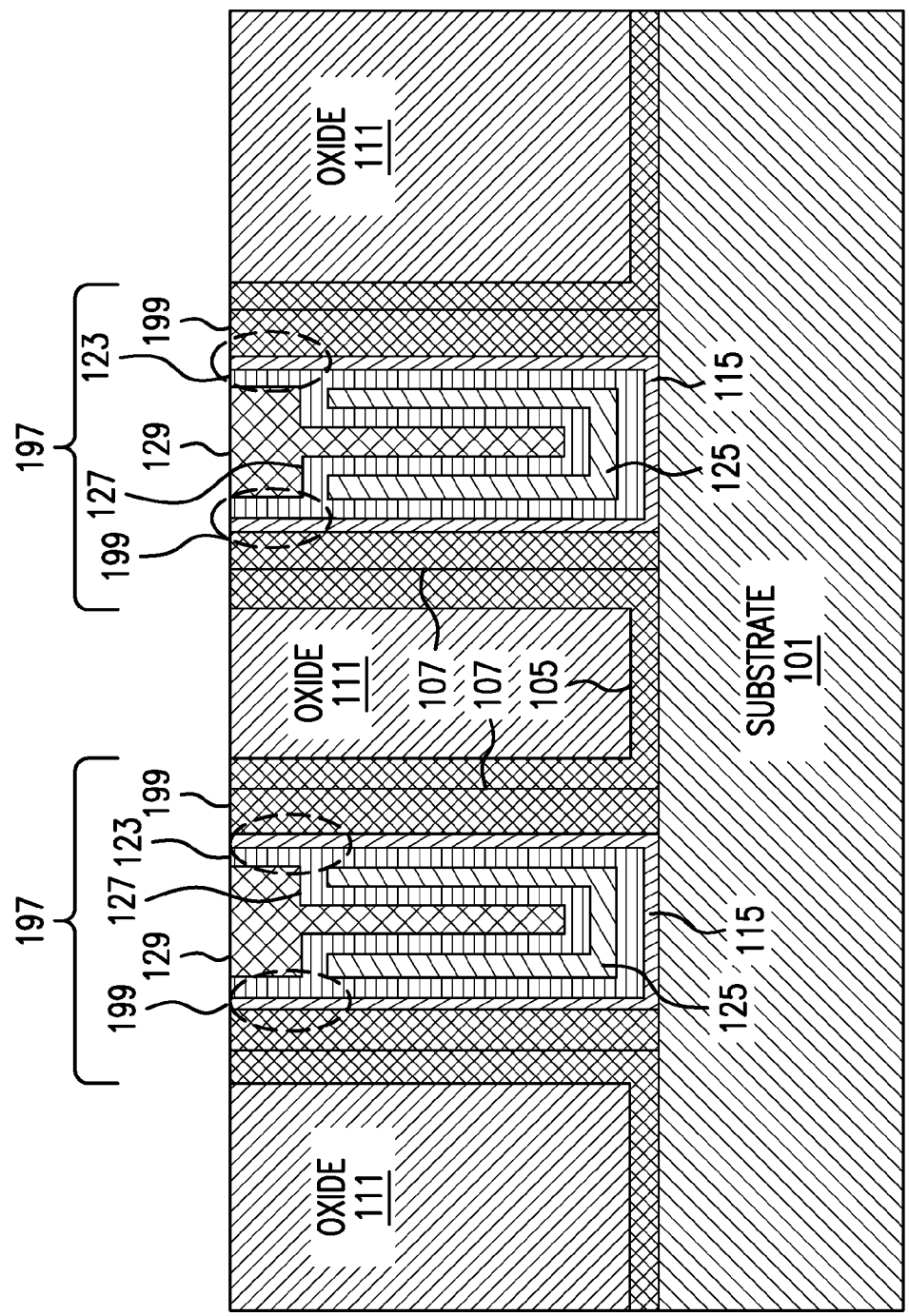
FIG. 1 shows FETs produced by an RMG process in accordance with the prior art.

FIG. 1 shows FETs produced by an RMG process in accordance with the prior art. Note the metal gate stacks 197. Source and drain regions will be located in the substrate 101 on either side of the gate structures in a well-known manner, and are omitted to avoid clutter. Substrate 101 has a SiN liner 105. Note oxide region 111 and spacers 107. Each gate stack area includes high-K material 115, first TiN layer 123, TiAlC layer 125, second TiN layer 127, and tungsten contact 129. During processing in accordance with the prior art, prior to planarization, the high-K 115 is in contact with high-density-plasma-deposited (HDP) oxide 111. This is an intermediate condition not visible in the view of FIG. 1, but is addressed in one or more embodiments as discussed below with respect to FIGS. 8-10. Regions 199 show a resulting potentially problematic area in prior art techniques.

Since the HDP oxide is deposited in the later stages of the RMG process, it cannot be annealed at high temperatures for long times to densify the oxide without significantly degrading the junctions. One or more embodiments advantageously disconnect the high-K layer from the HDP oxide prior to the high temperature reliability annealing process. Indeed, one or more embodiments chamfer the high-K layer prior to depositing the TiN and aSi layers for reliability annealing, so that there is no path for oxygen ingress during the high temperature processing.

Figure 2:
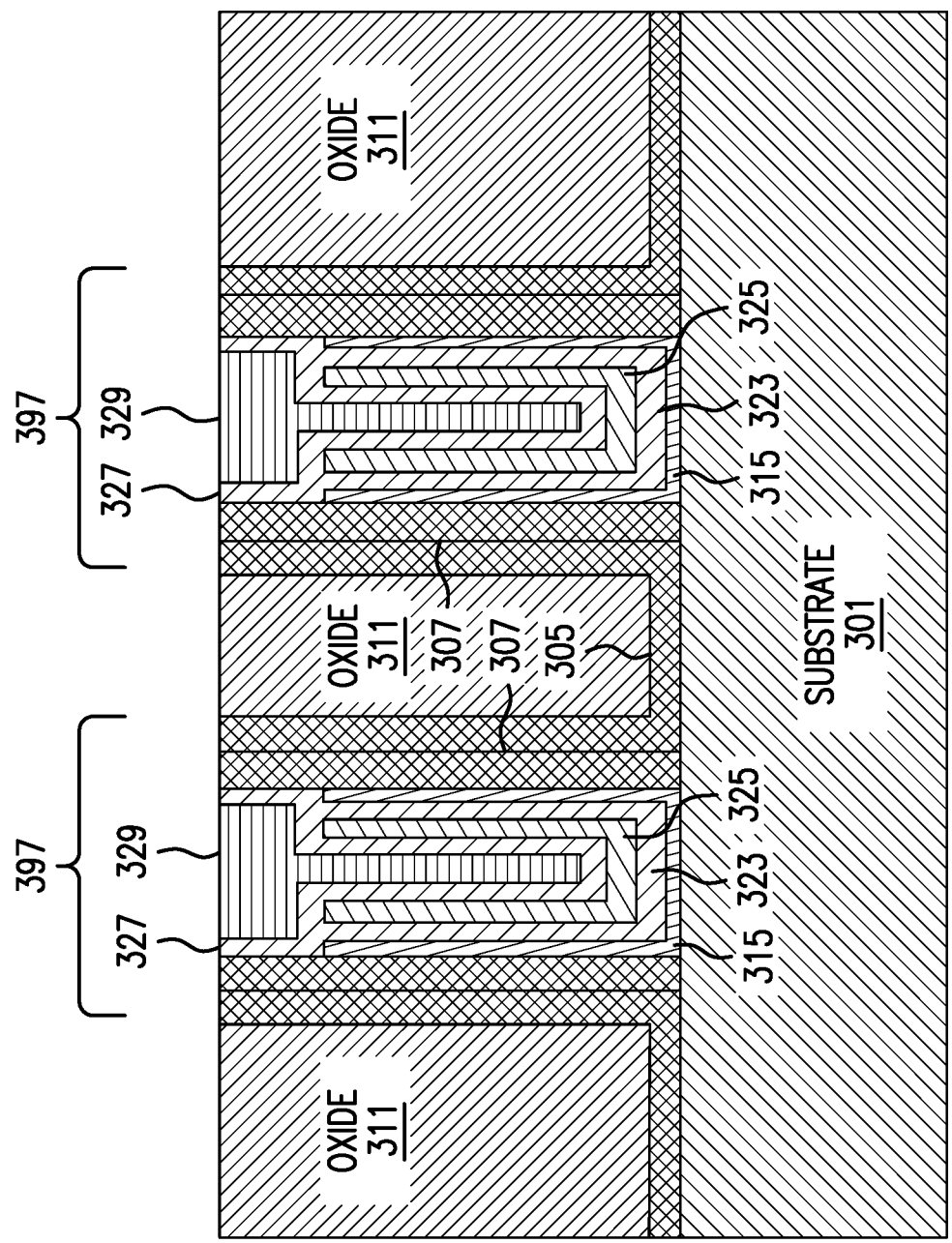
FIG. 2 shows FETs produced by an RMG process in accordance with an aspect of the disclosure.

FIG. 2 shows FETs produced by an RMG process in accordance with an aspect of the disclosure. Note the metal gate stacks 397. A substrate 301 has a SiN liner 305. Note oxide region 311 and spacers 307. Each gate stack area includes high-K material 315, first TiN layer 323, TiAlC layer 325, second TiN layer 327, and tungsten contact 329. The high-K 315 is chamfered, as discussed below, so that there is no path for oxygen ingress during the high temperature processing.

Figure 3:
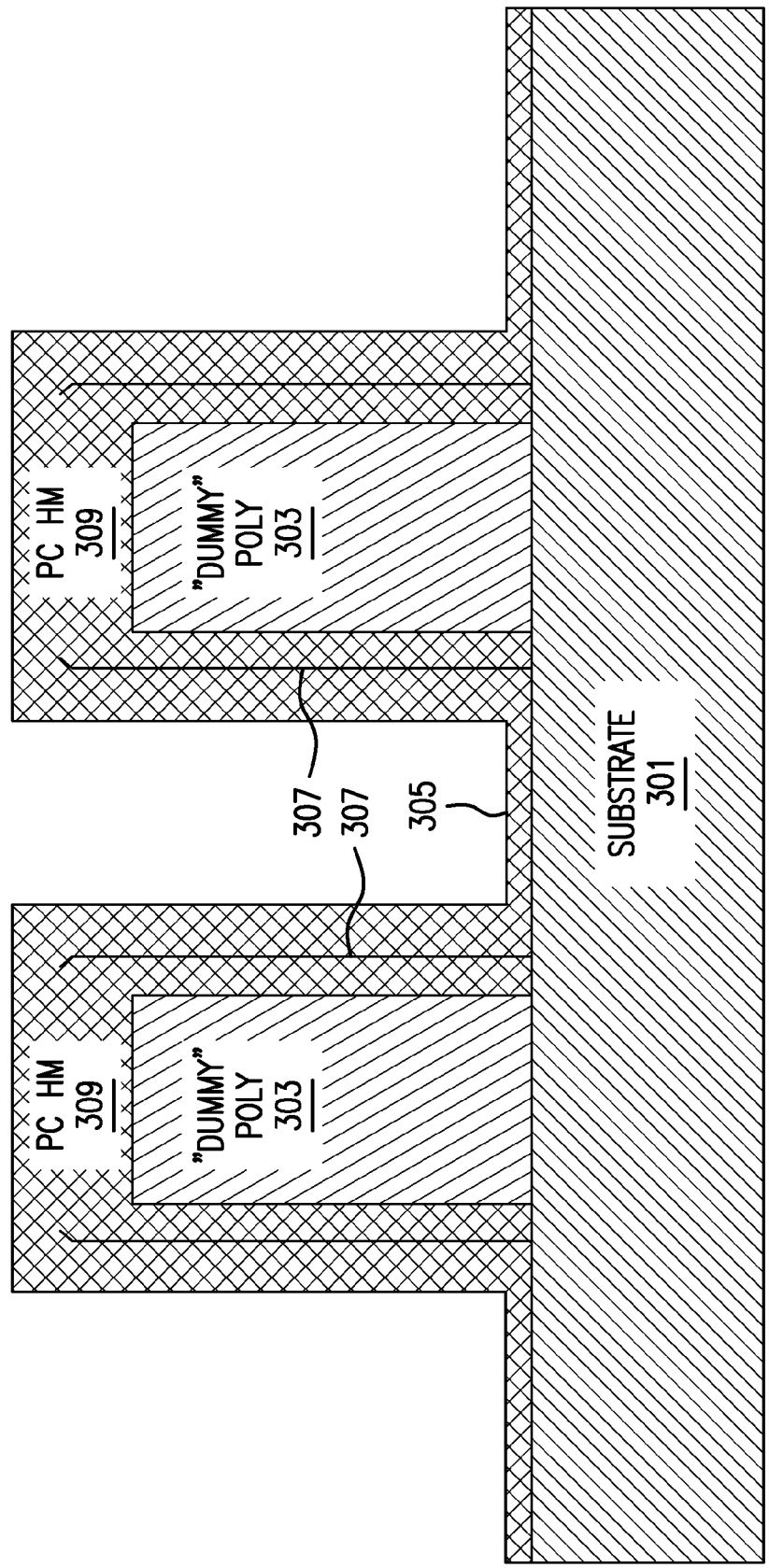
FIG. 3 shows an initial structure with a poly open chemical mechanical planarization, in accordance with an aspect of the disclosure.

FIG. 3 shows an initial structure with a SiN liner on dummy gates, in accordance with an aspect of the disclosure. In particular, FIG. 3 shows a substrate 301 with dummy gate structures including, e.g., "dummy" polysilicon 303; the substrate can be, for example, a silicon-on-insulator (SOI) substrate or bulk substrate with either a planar structure or a FIN structure for the channel area of the transistors. Note the SiN liner 305; spacer 307; and hardmask 309 to define the gate structure.

Figure 4:
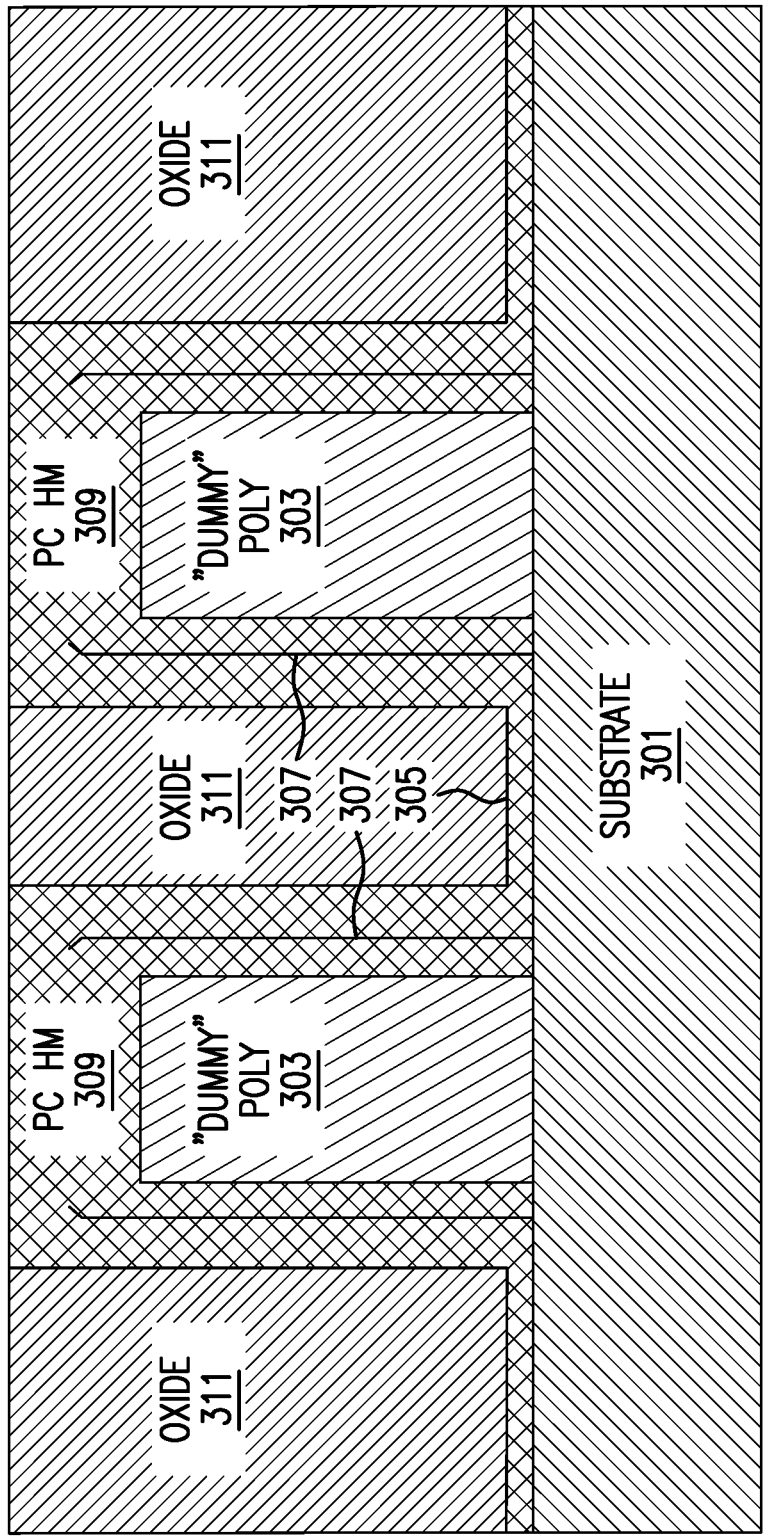
FIG. 4 shows flowable oxide (FOX) deposition or high density plasma-chemical vapor deposition (HDP-CVD) of oxide over the structure of FIG. 3, followed by chemical-mechanical polishing (CMP), in accordance with an aspect of the disclosure.

FIG. 4 shows flowable oxide (FOX) deposition or high density plasma-chemical vapor deposition (HDP-CVD) of silicon dioxide (deposited material generally 311) over the structure of FIG. 3, followed by chemical-mechanical polishing (CMP), in accordance with an aspect of the disclosure. The skilled artisan will appreciate that polymer hydrogen silsesquioxane (HSQ) solution in methyl isobutyl ketone (MIBK), commercially known as FOX (flowable oxide), is an alternative material to silicon dioxide obtained by chemical deposition.

Figure 5:
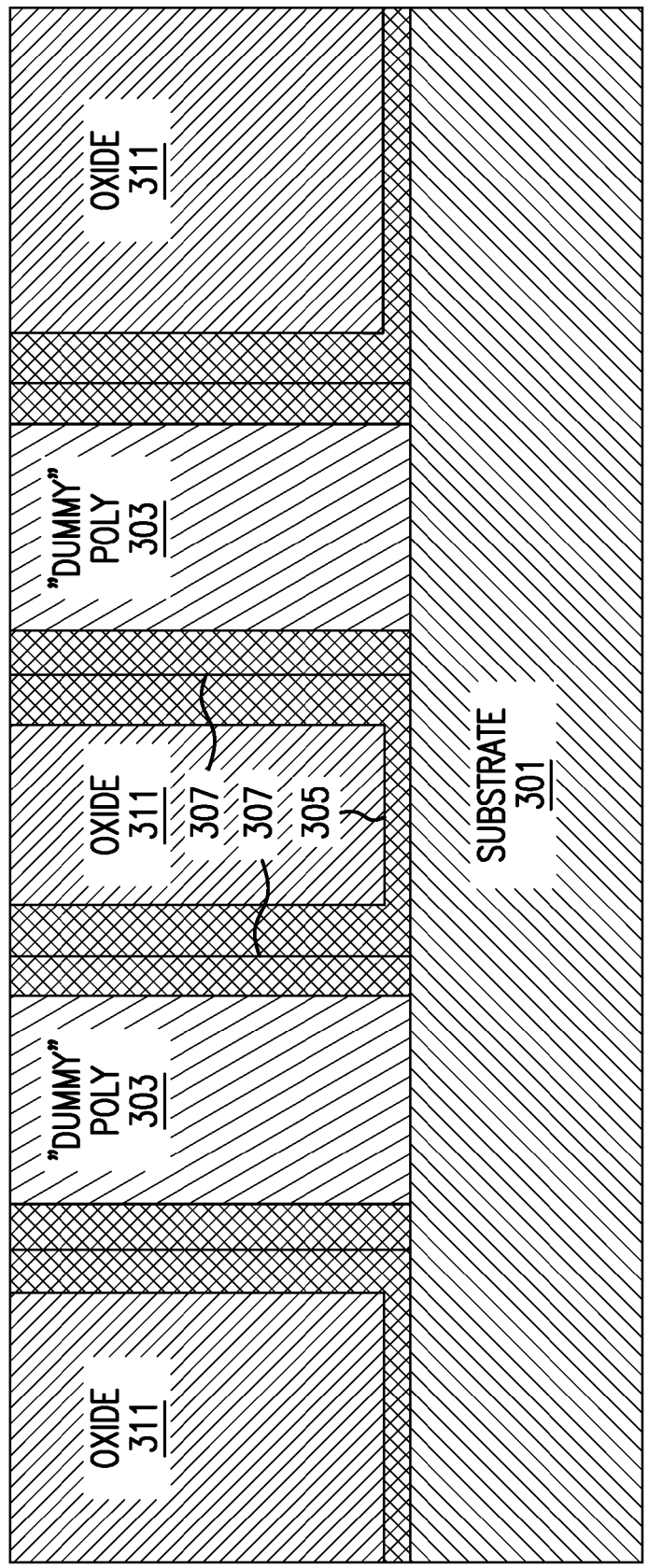
FIG. 5 shows removal of the nitride cap from the structure of FIG. 4, in accordance with an aspect of the disclosure.

FIG. 5 shows removal of the hardmask 309 from the structure of FIG. 4, in accordance with an aspect of the disclosure. Hardmask 309 can be removed, for example, by CMP, reactive ion etching, or wet etching.

Figure 6:
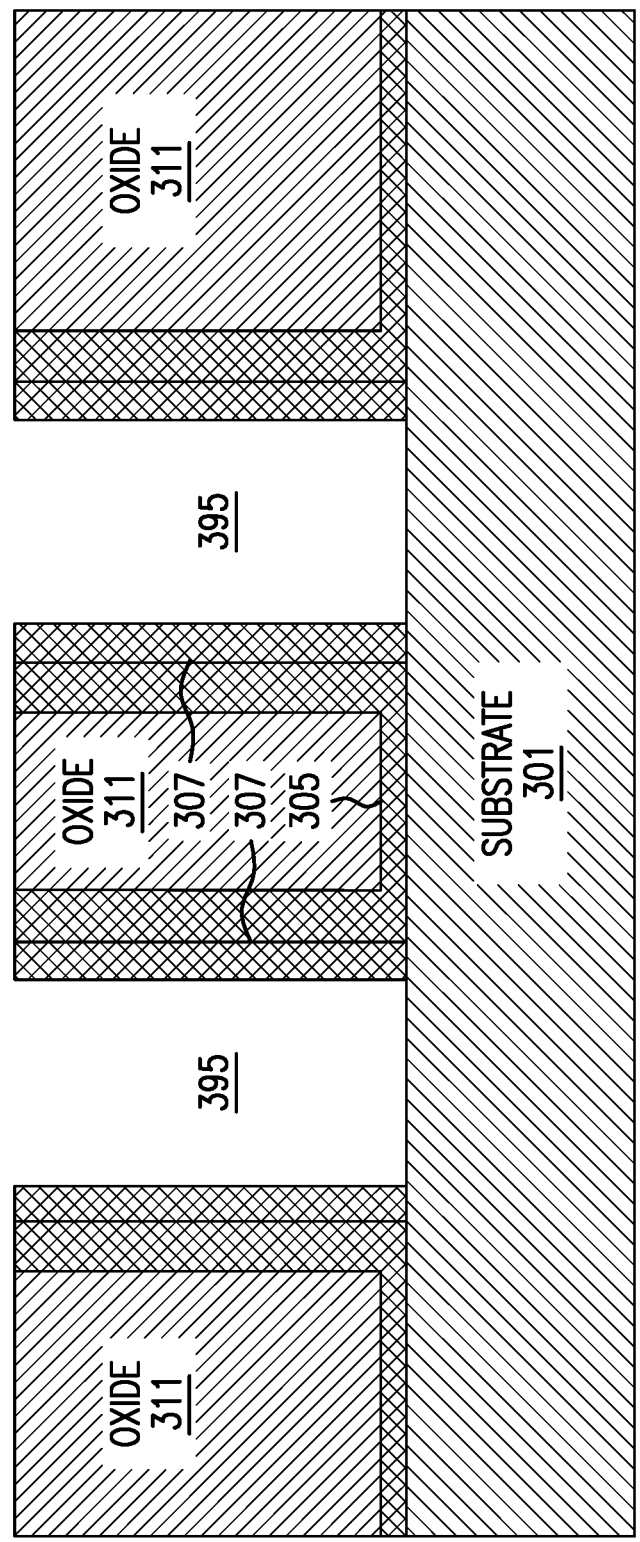
FIG. 6 shows stripping dummy poly from the structure of FIG. 5, in accordance with an aspect of the disclosure.

FIG. 6 shows stripping dummy poly from the structure of FIG. 5, in accordance with an aspect of the disclosure. The stripping of dummy poly can be done with wet etching (e.g. TMAH, diluted NH4OH) or reactive ion etching. Cavities 395 are discussed below.

Figure 7:
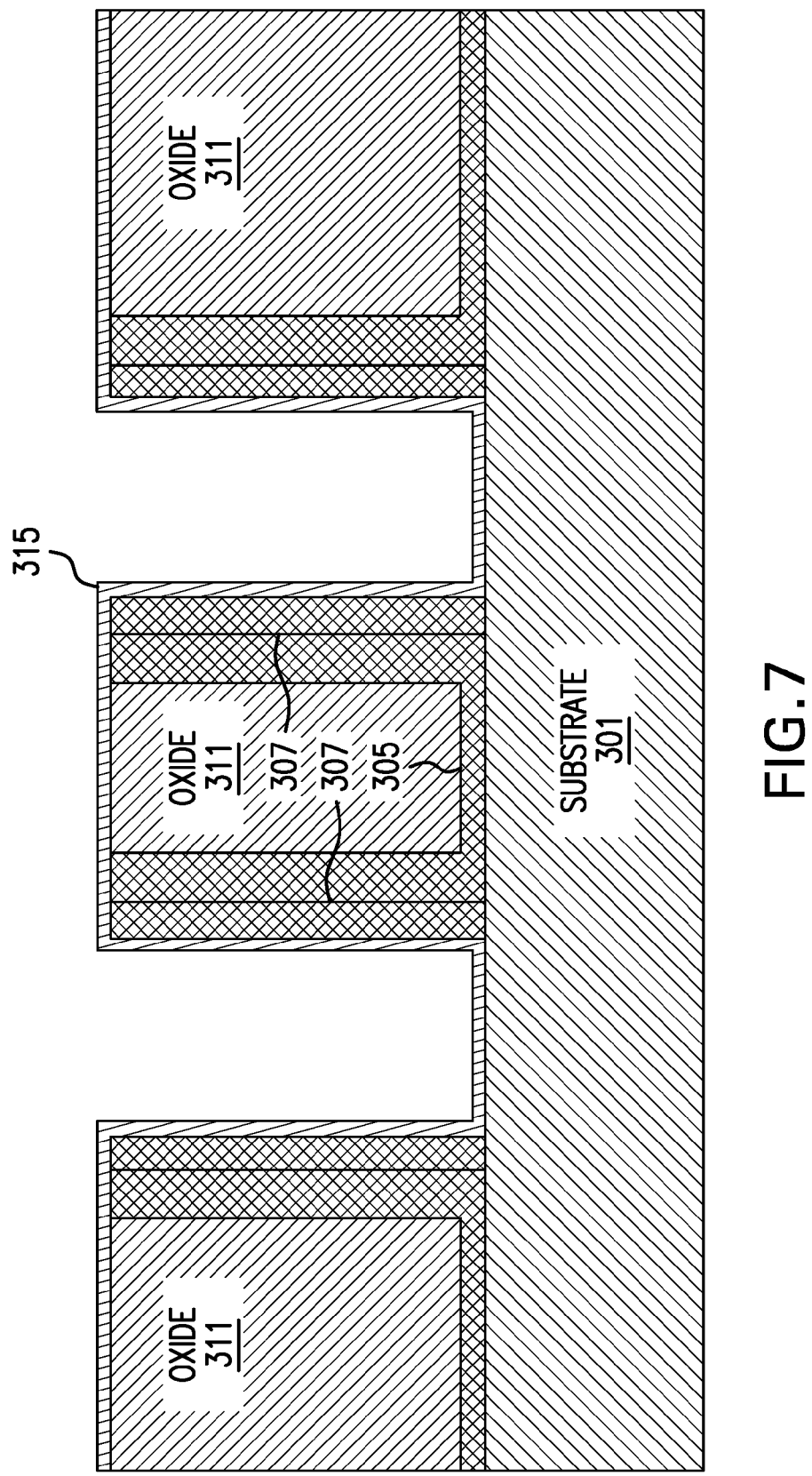
FIG. 7 shows deposition of high-K material over the structure of FIG. 6, in accordance with an aspect of the disclosure.

FIG. 7 shows deposition of high-K material 315 over the structure of FIG. 6, in accordance with an aspect of the disclosure. Hf-based high-K materials are typically deposited by atomic layer deposition (ALD) or chemical vapor deposition (CVD).

Figure 8:
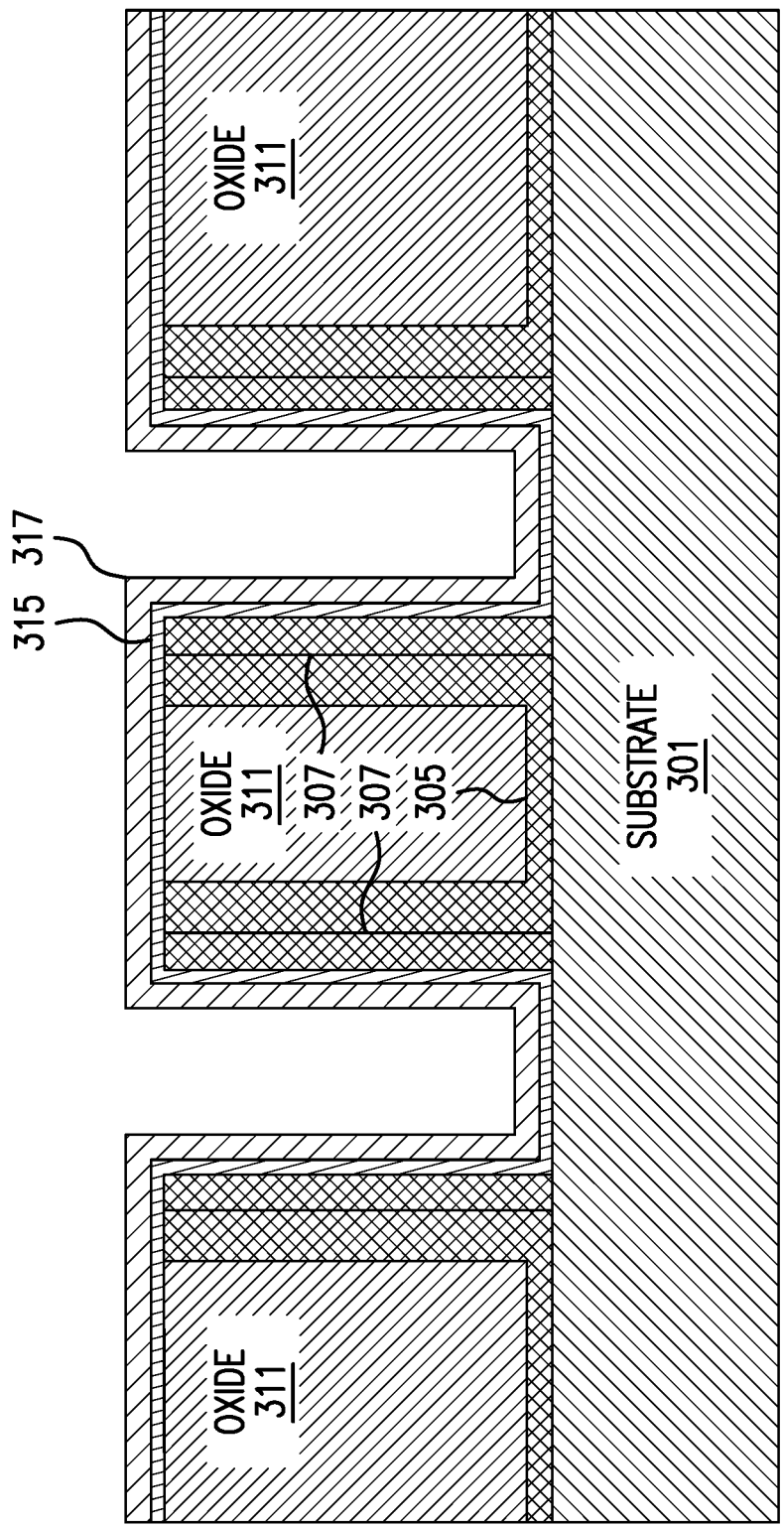
FIG. 8 shows Titanium Nitride (TiN) deposition over the structure of FIG. 7, in accordance with an aspect of the disclosure.

FIG. 8 shows deposition of Titanium Nitride (TiN) 317 over the structure of FIG. 7, in accordance with an aspect of the disclosure. ALD or CVD can be used for TiN deposition, for example. Note contact of layer 315 and oxide 311, which has proven problematic in prior art techniques but is addressed in one or more embodiments as discussed just below with regard to FIGS. 9 and 10.

Figure 9:
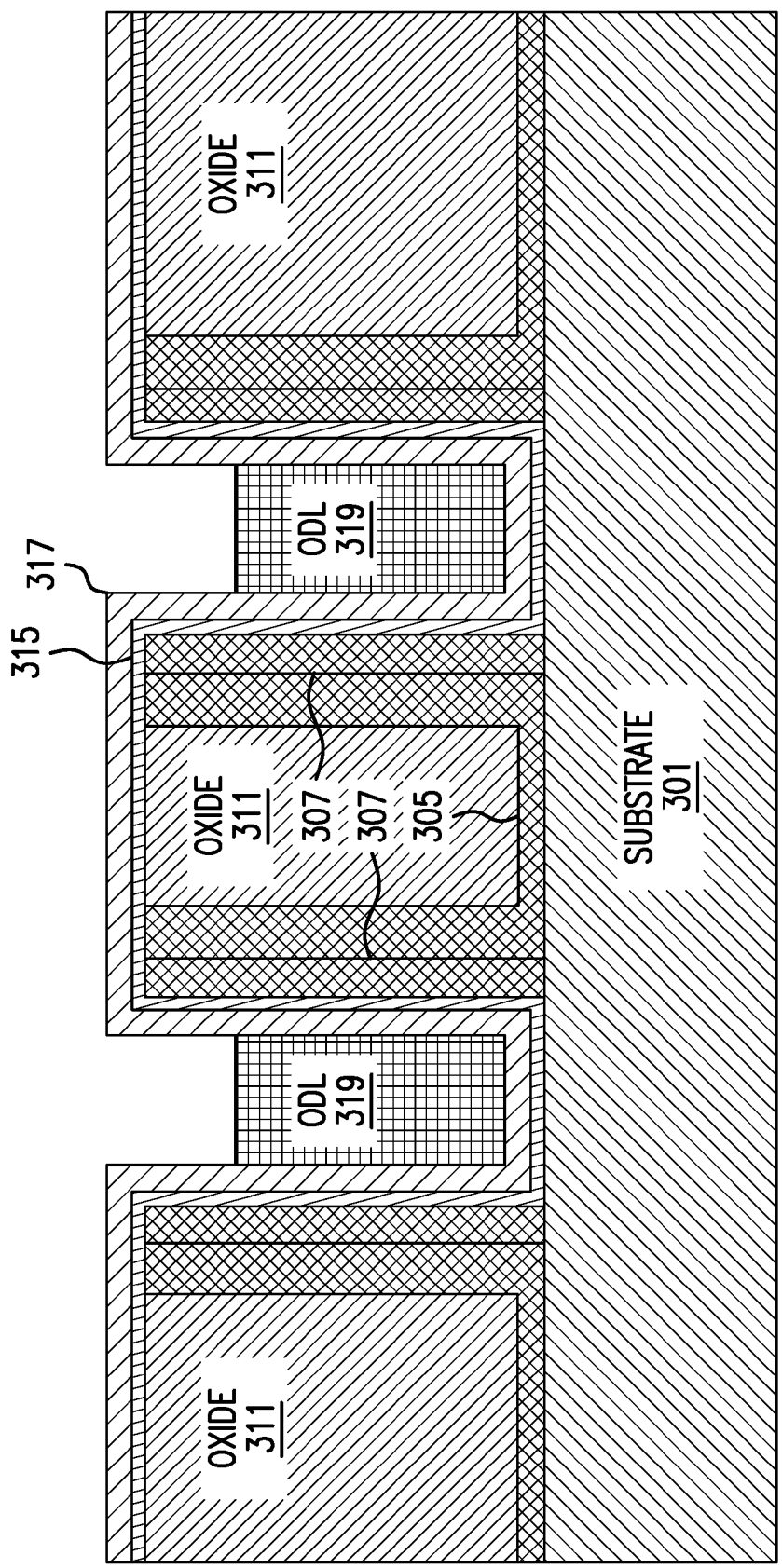
FIG. 9 shows filling and recessing with an organic dielectric layer (ODL) for the chamfering process, over the structure of FIG. 8, in accordance with an aspect of the disclosure.

FIG. 9 shows filling and recessing with an organic dielectric layer (ODL) 319 for the chamfering process, over the structure of FIG. 8, in accordance with an aspect of the disclosure.

Figure 10:
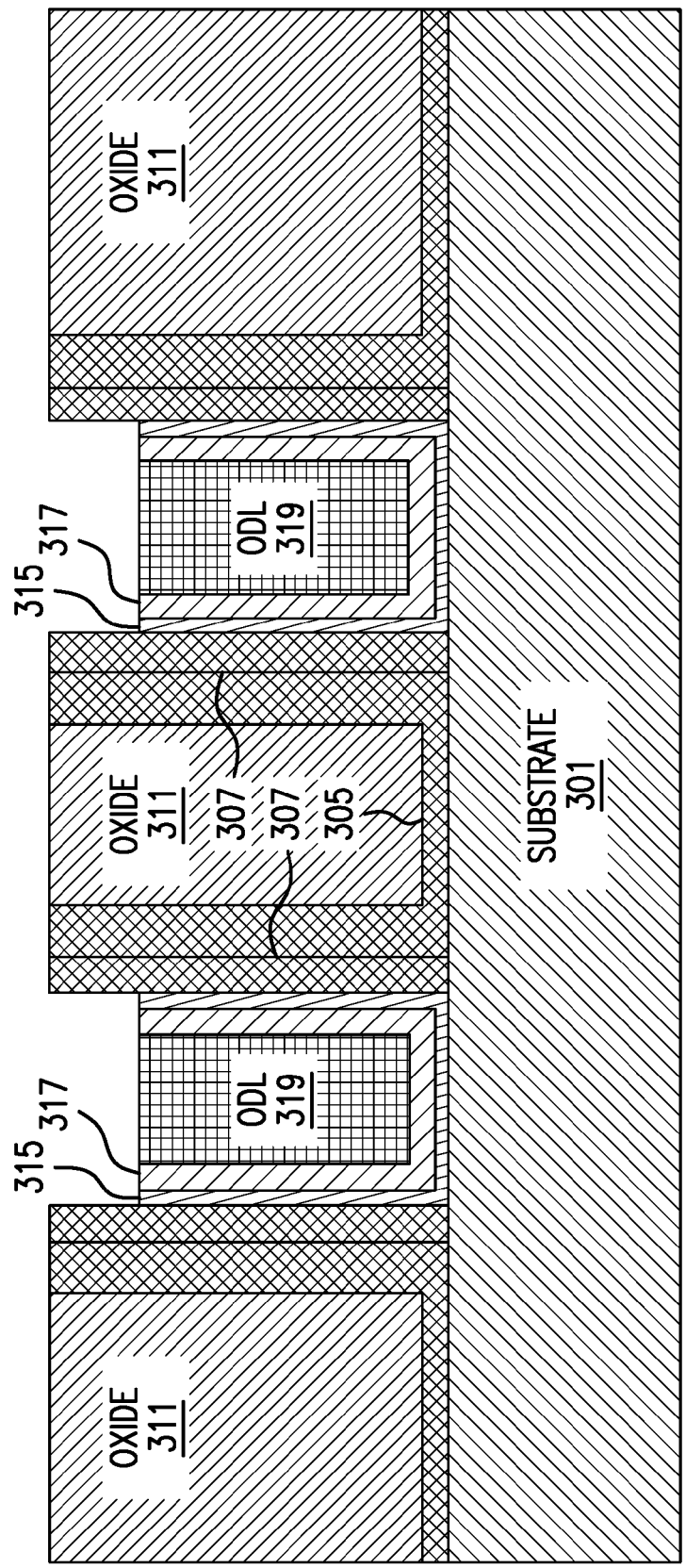
FIG. 10 shows chamfering the TiN and high-K material of the structure of FIG. 9, in accordance with an aspect of the disclosure.

FIG. 10 shows chamfering the TiN 317 and high-K material 315 of the structure of FIG. 9, in accordance with an aspect of the disclosure. The high-K material 315 and TiN 317 can be chamfered using, for example, reactive-ion etching (ME) or the well-known wet SC1 process.

Figure 11:
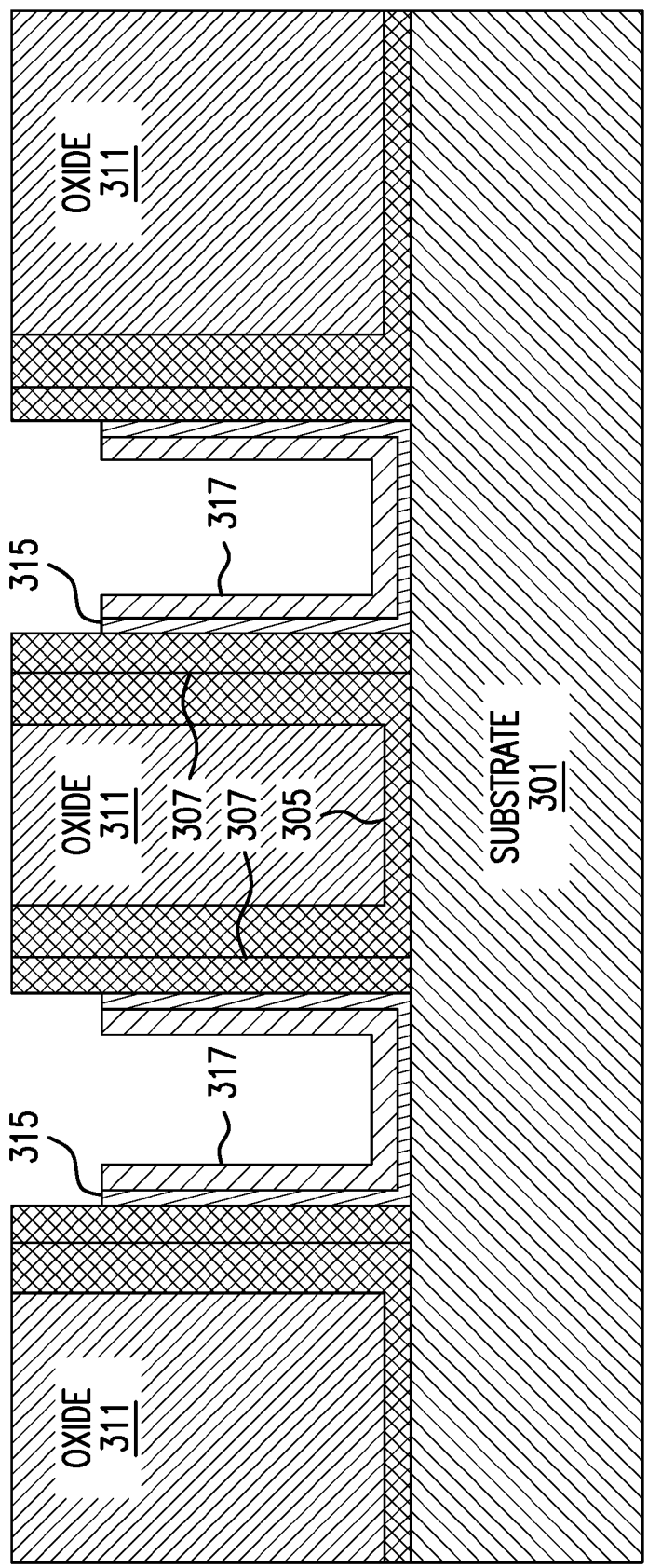
FIG. 11 shows stripping the ODL off the structure of FIG. 10, in accordance with an aspect of the disclosure.

FIG. 11 shows stripping the ODL off the structure of FIG. 10, in accordance with an aspect of the disclosure.

Figure 12:
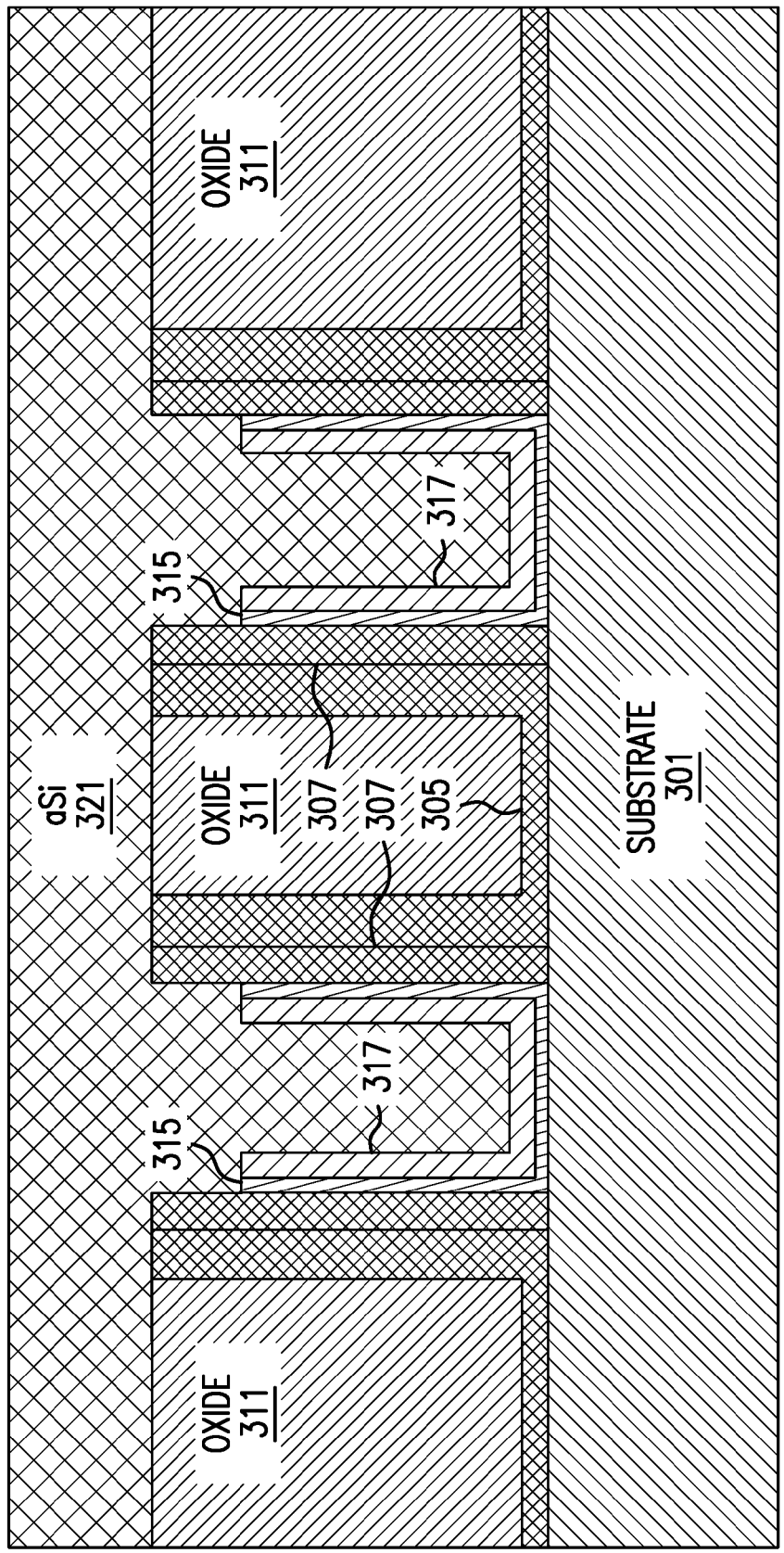
FIG. 12 shows deposition of amorphous silicon (aSi) over the structure of FIG. 11, in accordance with an aspect of the disclosure.

FIG. 12 shows deposition of amorphous silicon (aSi) 321 over the structure of FIG. 11, in accordance with an aspect of the disclosure, in preparation for reliability annealing. A CVD process is typically used. High temperature anneal (>950 C, 0 (spike)-5 sec) is performed at this step with the presence of aSi, in one or more embodiments.

Figure 13:
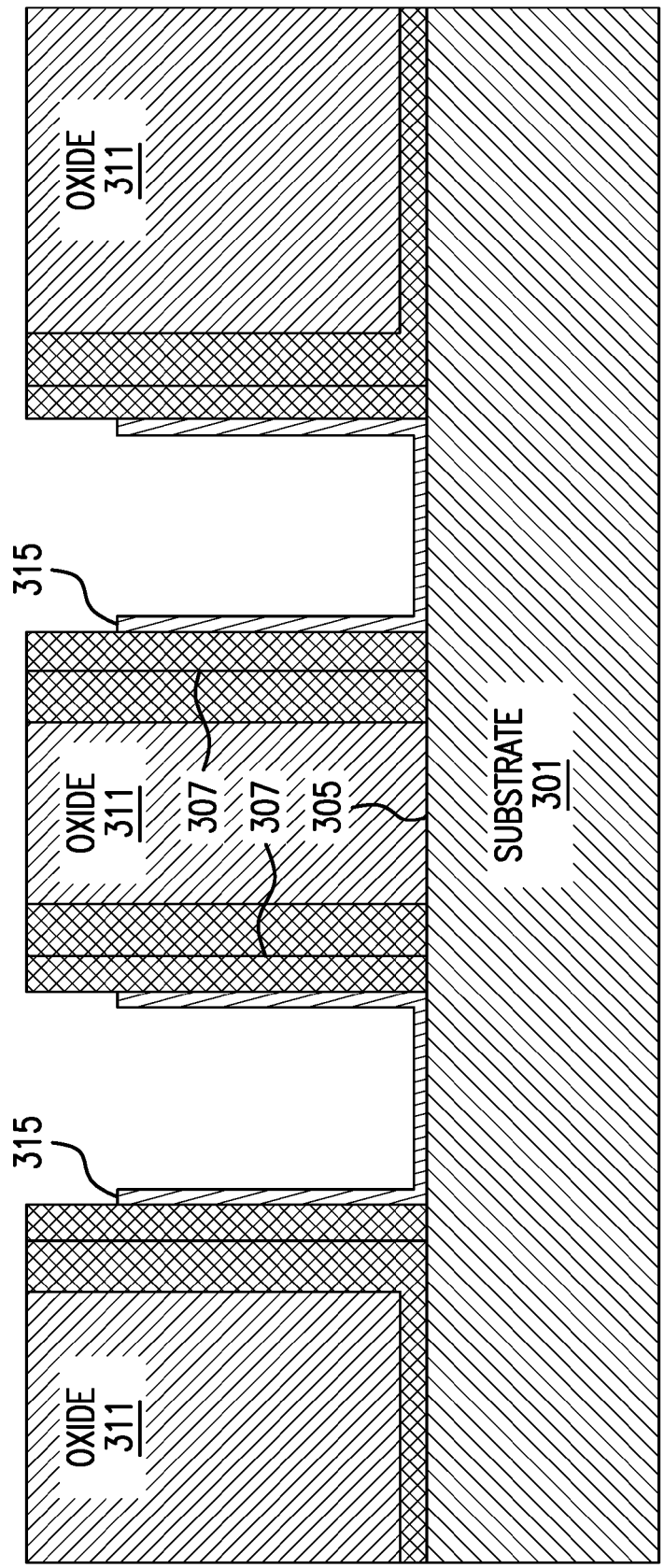
FIG. 13 shows stripping off the aSi and TiN from the structure of FIG. 12, in accordance with an aspect of the disclosure.

FIG. 13 shows stripping off the aSi and TiN from the structure of FIG. 12, in accordance with an aspect of the disclosure. One or more non-limiting exemplary embodiments employ wet etching (TMAH, or diluted NH4OH) or reactive etching for aSi removal, and SC1 for TiN removal.

Figure 14:
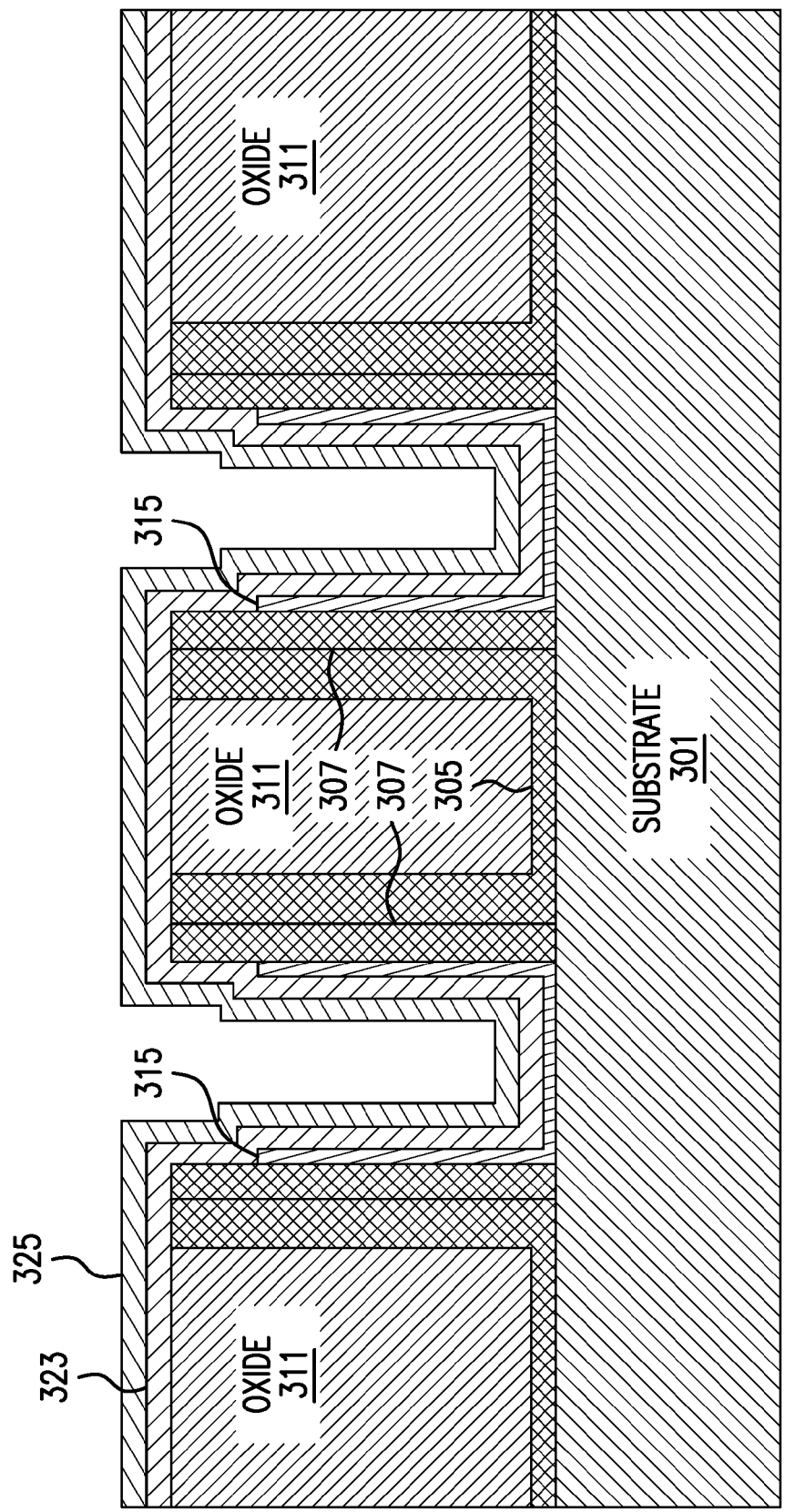
FIG. 14 shows gate stack metals deposition (TiN and Al-doped titanium carbide (TiAlC)) over the structure of FIG. 13, in accordance with an aspect of the disclosure.

FIG. 14 shows gate stack metals deposition (TiN 323 and titanium carbide (TiC) 325) over the structure of FIG. 13, in accordance with an aspect of the disclosure (ALD or CVD can be employed, for example).

Figure 15:
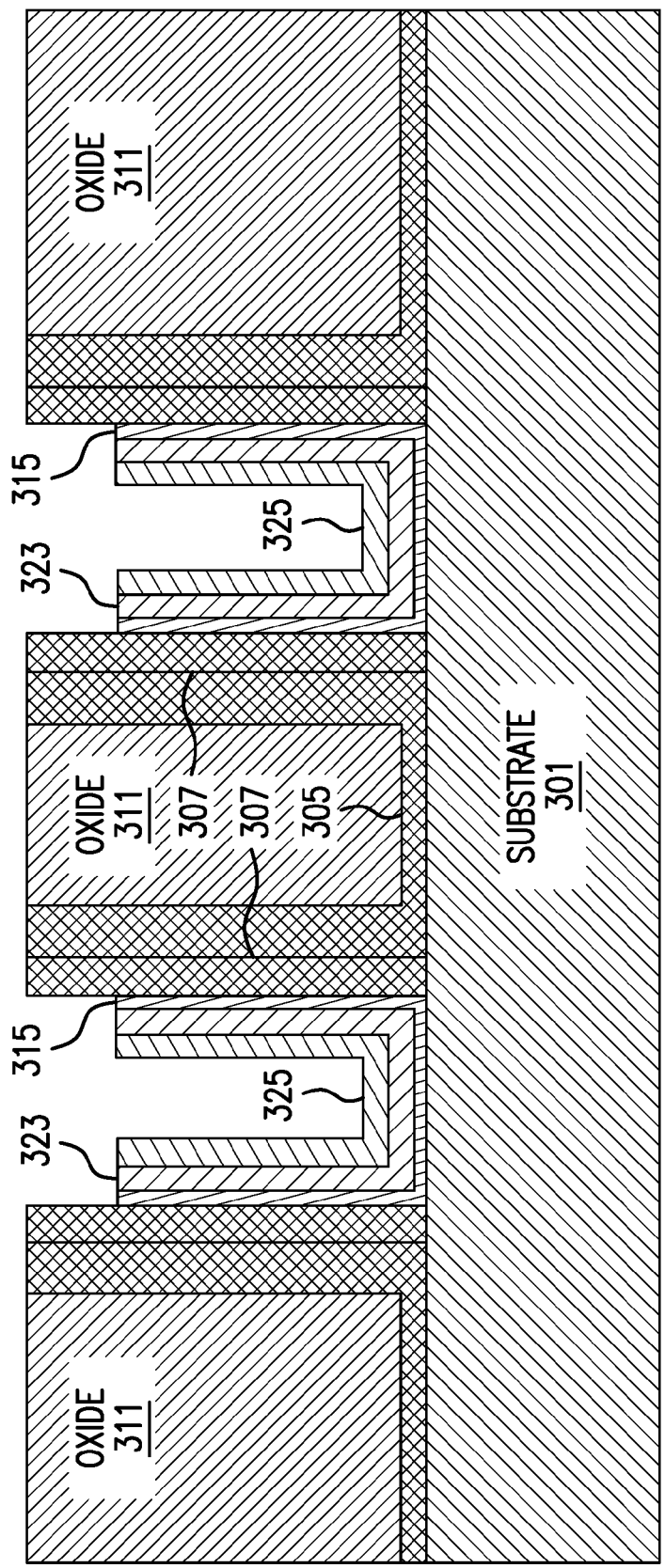
FIG. 15 shows chamfering of the TiN and TiAlC of the structure of FIG. 14, in accordance with an aspect of the disclosure.

FIG. 15 shows chamfering of the TiN and TiAlC of the structure of FIG. 14, in accordance with an aspect of the disclosure, following the usual RMG flow.

Figure 16:
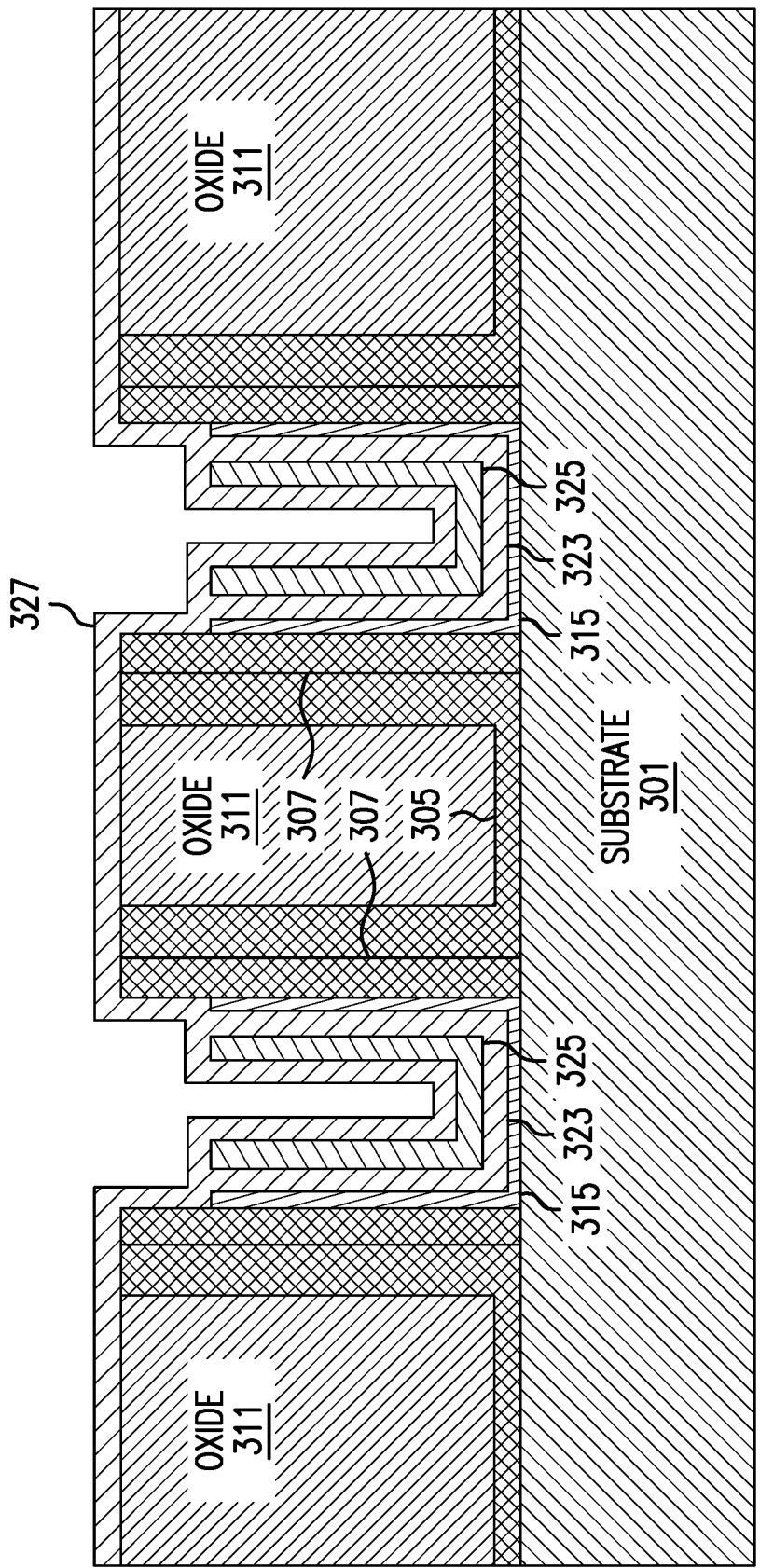
FIG. 16 shows wetting TiN deposition over the structure of FIG. 15, in accordance with an aspect of the disclosure.

FIG. 16 shows deposition of wetting TiN 327 over the structure of FIG. 15, in accordance with an aspect of the disclosure (ALD or CVD can be employed, for example, and TaN is an alternative material).

Figure 17:
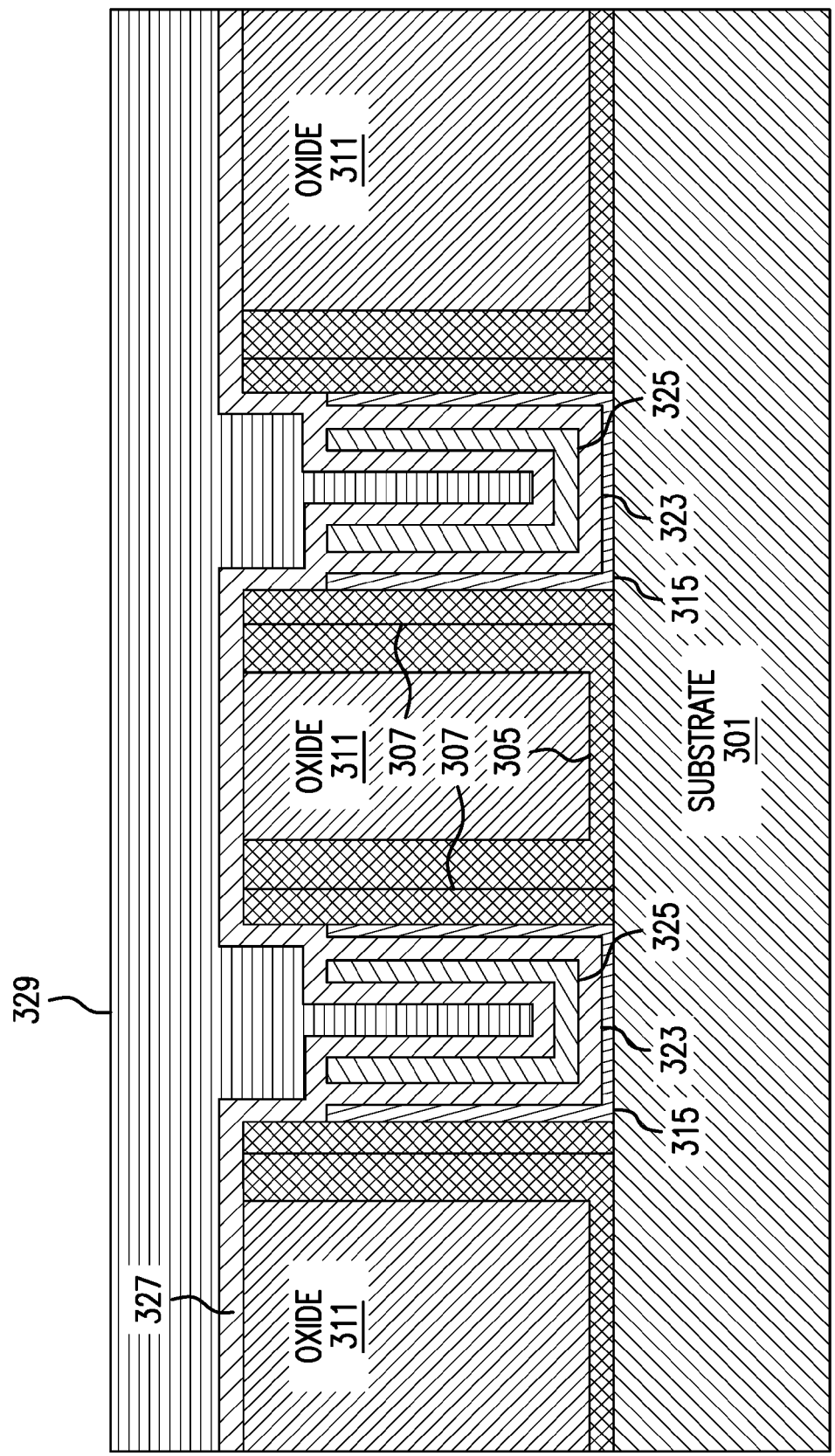
FIG. 17 shows tungsten (W) deposition over the structure of FIG. 16, in accordance with an aspect of the disclosure.

FIG. 17 shows deposition of tungsten (W) 329 over the structure of FIG. 16, in accordance with an aspect of the disclosure (e.g., via CVD).

Figure 18:
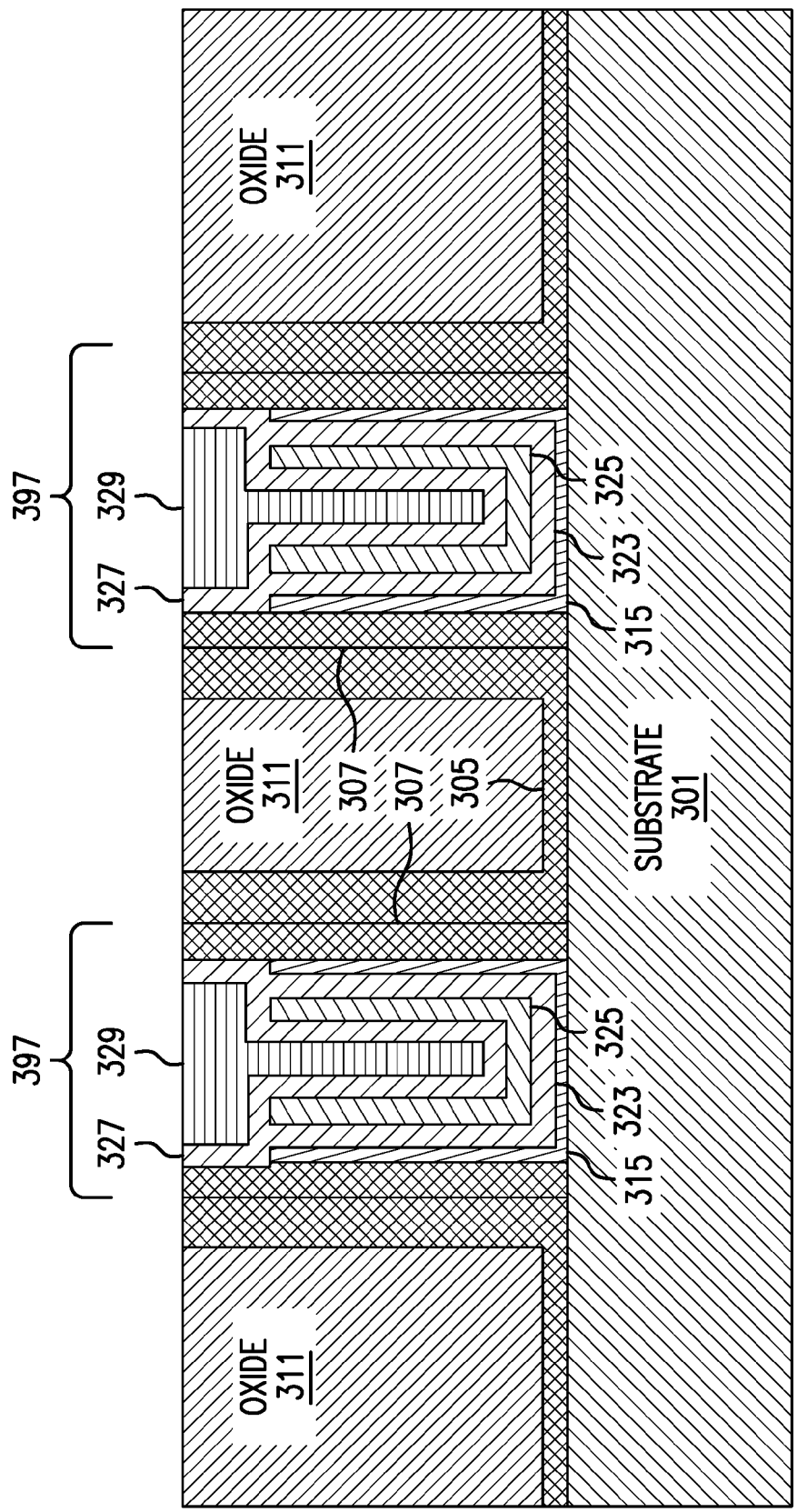
FIG. 18 shows CMP of the tungsten of FIG. 17, resulting in the final structure of FIG. 2, in accordance with an aspect of the disclosure.

FIG. 18 shows CMP of the tungsten of FIG. 17, resulting in the final structure of FIG. 2, in accordance with an aspect of the disclosure.

Figure 19:
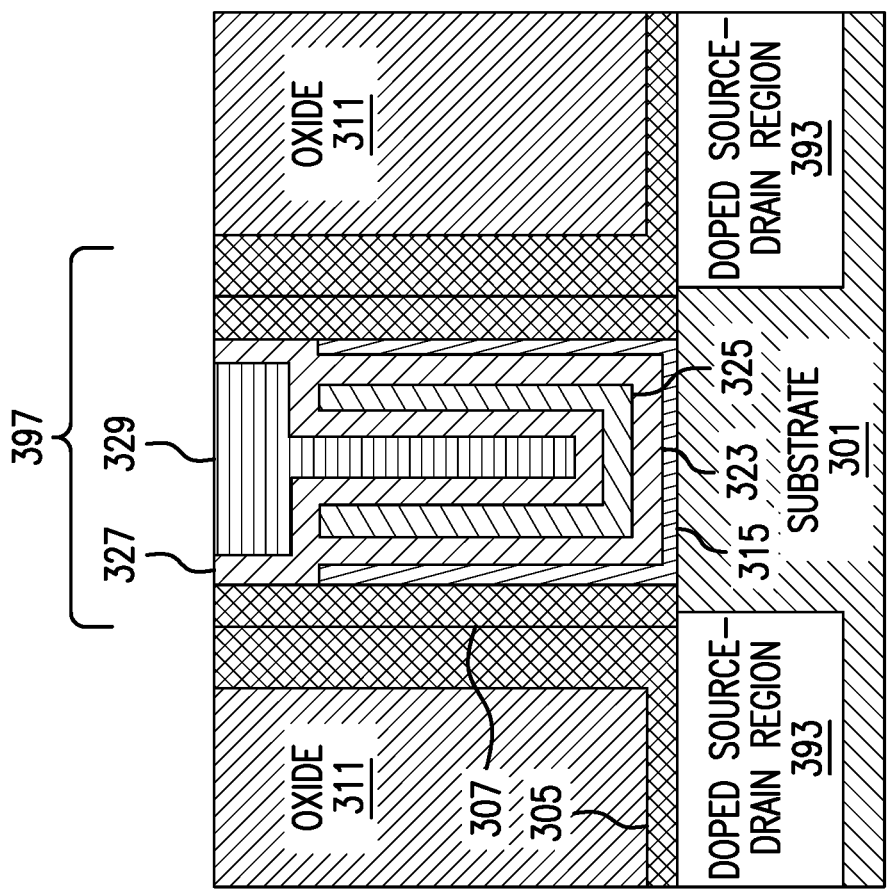
FIG. 19 shows a detail of the final structure of FIGS. 2 and 18, including source-drain regions.

FIG. 19 shows a detail of the final structure of FIGS. 2 and 18, including appropriately doped source-drain regions 393 located in the substrate 301 on either side of the gate stack 397 in a well-known manner.

One or more embodiments improve upon the techniques disclosed in U.S. Pat. No. 8,999,831 issued on 7 Apr. 2015 (expressly incorporated herein by reference in its entirety for all purposes), which includes a high temperature anneal with the presence of dummy amorphous Si layer in RMG flow. One or more embodiments advantageously perform High-k chamfering or recessing prior to this high temperature anneal. This enables disconnecting a high-k path between the field oxide and the active device area at the time of the high temperature anneal, resulting in suppression of unwanted migration of oxygen via the High-k path. One or more embodiments do not require oxygen scavengers, oxidation masking, or other undesirable extra layers.

Given the discussion thus far, and referring to FIG. 2, it will be appreciated that, in general terms, an exemplary semiconductor structure, according to an aspect of the disclosure, includes a semiconductor substrate 301 having an outer surface; a plurality of metal gate stacks 397 located outward of the outer surface of the semiconductor substrate; and a plurality of oxide regions 311. The oxide regions 311 are located outward of the outer surface of the semiconductor substrate, and are interspersed between the plurality of metal gate stacks 397. Also included is a liner 305 interspersed between the plurality of oxide regions 311 and the semiconductor substrate 301 and between the plurality of oxide regions 311 and the plurality of metal gate stacks 397. A plurality of high-K layers 315 separate the plurality of metal gate stacks 397 from the semiconductor substrate 301 and separate the plurality of metal gate stacks 397 from the plurality of oxide regions 311. The plurality of oxide regions 311 and the plurality of metal gate stacks 397 extend outwardly a first height from the semiconductor substrate 301. The plurality of high-K layers 315 extend outwardly a second height from the semiconductor substrate 301. The second height is less than the first height.

Figure 20:
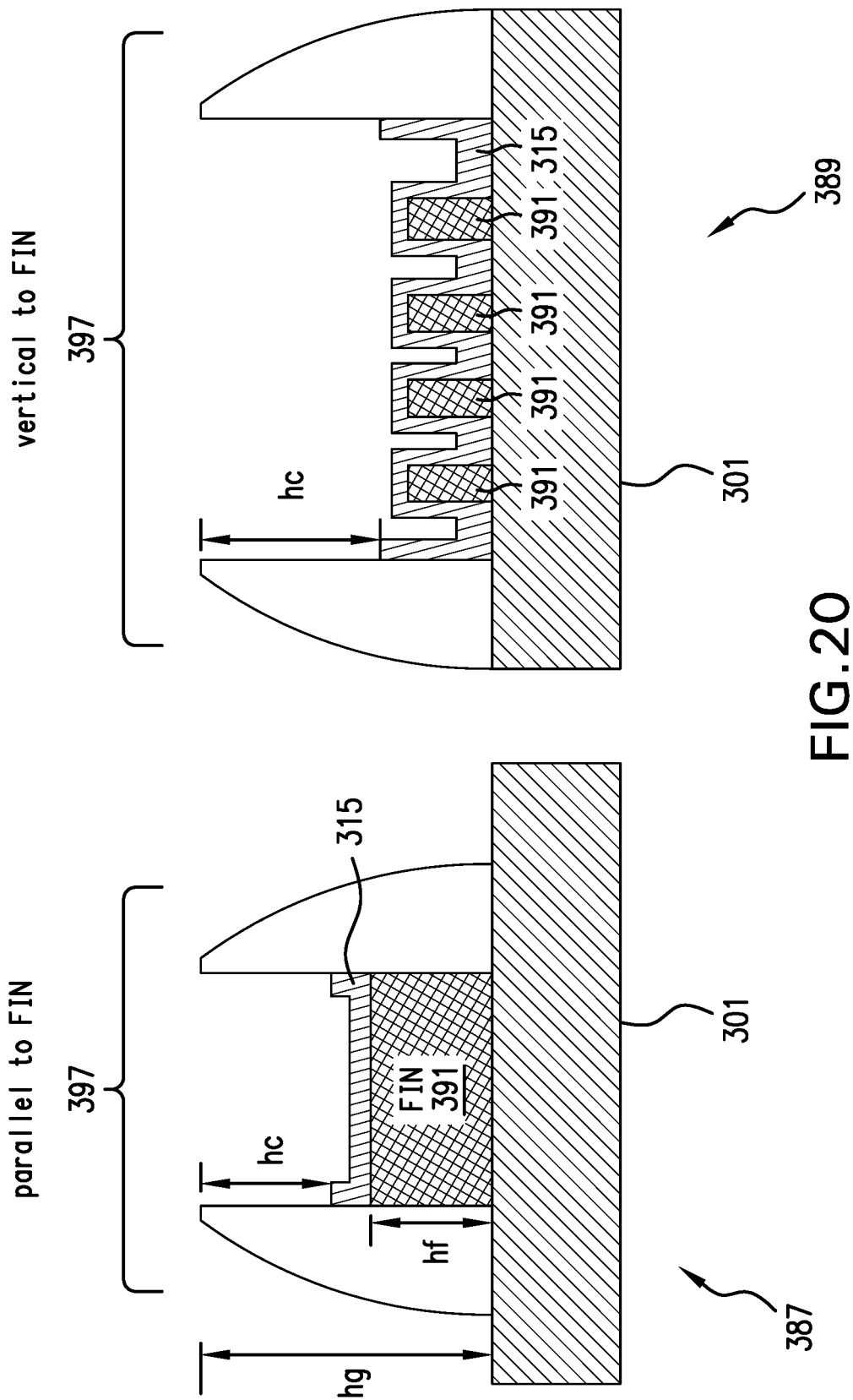
FIG. 20 shows exemplary details of chamfering, in accordance with an aspect of the disclosure.

Referring now to FIG. 20, in one or more embodiments, the chamfering amount is more than the polishing margin for the CMP process but not so much as to reach the FIN top surface. In particular, as noted above, the substrate 301 can be, for example, a silicon-on-insulator (SOI) substrate or bulk substrate with either a planar structure or a FIN structure 391 for the channel area of the transistors. FIG. 20 shows a non-limiting FIN example. View 387 is parallel to the FIN while view 389 is vertical to the FIN(s). The FIN 391 is located within the gate trench and has a top surface above the substrate a fin height $h_f$. The gate height is $h_g$. The chamfer amount for the high-K 315 is $k_c$. The chamfer amount $h_c$ is greater than zero (and, practically, greater than the CMP polish margin) but is not so much as to reach the top surface of the FIN (i.e., is less than $h_g$-$h_f$).

Thus, in some instances, the structure further includes a plurality of FINS 391 intermediate the plurality of high-K layers 315 and the substrate 301, and the second height is such that the plurality of high-K layers extend outwardly beyond the plurality of FINS.

The substrate includes, for example, a silicon-on-insulator substrate or a bulk substrate.

The oxide regions include, for example, silicon dioxide or flowable oxide.

The liner includes, for example, silicon nitride.

The high-K layers include, for example, a metal oxide with a dielectric constant greater than that of silicon dioxide.

Furthermore, given the discussion thus far, and referring to FIG. 6, it will be appreciated that, in general terms, an exemplary method, according to another aspect of the disclosure, includes the step of providing a semiconductor structure, The semiconductor structure in turn includes a semiconductor substrate 301 having an outer surface; a plurality of oxide regions 311, located outward of the outer surface of the semiconductor substrate, and defining a plurality of metal-gate-stack-receiving cavities 395; and a liner 305 interspersed between the plurality of oxide regions 311 and the semiconductor substrate 301 and between the plurality of oxide regions 311 and the plurality of metal-gate-stack-receiving cavities 395.

As best seen in FIG. 7, a further step includes depositing a layer of high-K material 315 over the semiconductor structure, including on outer surfaces of the plurality of oxide regions 311, outer edges of the liner 305, on walls of the plurality of metal-gate-stack-receiving cavities 395, and on the outer surface of the semiconductor substrate 301 within the plurality of metal-gate-stack-receiving cavities 395.

As best seen in FIG. 10, a still further step includes chamfering the layer of high-K material 315 to remove same from the outer surfaces of the plurality of oxide regions 311, the outer edges of the liner 305, and partially down the walls of the plurality of metal-gate-stack-receiving cavities 395, to obtain a first intermediate structure.

The chamfering may be, for example, by an amount greater than a chemical mechanical polishing margin, but not so much as to reach a FIN surface underlying the high-K material.

In some instances, further steps include, as best seen in FIG. 12, depositing amorphous silicon 321 over the first intermediate structure to obtain a second intermediate structure, and carrying out reliability annealing on the second intermediate structure; and, as best seen in FIGS. 13-18, removing the amorphous silicon, and forming a plurality of metal gate stacks in the plurality of metal-gate-stack-receiving cavities.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor substrate having an outer surface;
a plurality of metal gate stacks located outward of said outer surface of said semi conductor substrate;
a plurality of oxide regions, located outward of said outer surface of said semiconductor substrate, and interspersed between said plurality of metal gate stacks;
a liner interspersed between said plurality of oxide regions and said semiconductor substrate and between said plurality of oxide regions and said plurality of metal gate stacks; and
a plurality of high-K layers separating said plurality of metal gate stacks from said semiconductor substrate and disposed between said plurality of metal gate stacks and said plurality of oxide regions;
wherein:
said plurality of oxide regions and said plurality of metal gate stacks extend outwardly to a first height from said semiconductor substrate; and
said plurality of high-K layers extend outwardly to a second height from said semiconductor substrate, said second height being less than said first height;
further comprising a plurality of FINS protruding from said substrate between said plurality of oxide regions and intermediate said plurality of high-K layers and said substrate, wherein said second height is such that said plurality of high-K layers extend outwardly beyond said plurality of FINS.

2. The structure of claim 1, wherein said substrate comprises a silicon-on-insulator substrate.

3. The structure of claim 1, wherein said substrate comprises a bulk substrate.

4. The structure of claim 1, wherein said oxide regions comprise silicon dioxide.

5. The structure of claim 1, wherein said oxide regions comprise flowable oxide.

6. The structure of claim 1, wherein said liner comprises silicon nitride.

7. The structure of claim 1, wherein said high-K layers comprise a metal oxide with a dielectric constant greater than that of silicon dioxide.

* * * * *